(12) United States Patent
Fosnight et al.

(10) Patent No.: US 9,142,437 B2
(45) Date of Patent: Sep. 22, 2015

(54) SYSTEM FOR SEPARATELY HANDLING DIFFERENT SIZE FOUPS

(71) Applicant: GLOBALFOUNDRIES Inc., Grand Cayman (KY)

(72) Inventors: William J. Fosnight, Saratoga Springs, NY (US); Ryan J. Gallagher, Saratoga Springs, NY (US); Stephen B. Miner, Gansevoort, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 141 days.

(21) Appl. No.: 13/859,773

(22) Filed: Apr. 10, 2013

(65) Prior Publication Data

US 2014/0308108 A1 Oct. 16, 2014

(51) Int. Cl.
 *B66F 19/00* (2006.01)
 *H01L 21/677* (2006.01)
 *H01L 21/673* (2006.01)

(52) U.S. Cl.
 CPC .... *H01L 21/67775* (2013.01); *H01L 21/67379* (2013.01)

(58) Field of Classification Search
 CPC .......... H01L 21/68707; H01L 21/67772; H01L 21/681; H01L 21/67775; H01L 21/67379; B65B 21/18; B62B 1/145; B23Q 7/04; B65G 47/57; G06Q 10/087; G11B 17/225
 USPC .......... 294/213, 902; 414/217.1, 416.05, 490; 198/346.2, 463.2; 700/213–214, 218
 See application file for complete search history.

(56) References Cited

U.S. PATENT DOCUMENTS

| | | | |
|---|---|---|---|
| 6,013,920 A * | 1/2000 | Gordon et al. | 250/559.36 |
| 6,447,232 B1 * | 9/2002 | Davis et al. | |
| 6,678,583 B2 * | 1/2004 | Nasr et al. | 700/245 |
| 6,981,832 B2 * | 1/2006 | Zinger et al. | 414/217 |
| 7,409,263 B2 * | 8/2008 | Elliot et al. | |
| 7,648,018 B2 * | 1/2010 | Inui | |
| 7,887,276 B2 * | 2/2011 | Natume | |
| 2001/0038783 A1 * | 11/2001 | Nakashima et al. | |
| 2006/0188360 A1 * | 8/2006 | Bonora et al. | |
| 2008/0031708 A1 * | 2/2008 | Bonora et al. | 414/217 |
| 2008/0118334 A1 * | 5/2008 | Bonora | 414/222.02 |
| 2012/0216743 A1 * | 8/2012 | Itoh et al. | 117/88 |

* cited by examiner

*Primary Examiner* — Stephen Vu
(74) *Attorney, Agent, or Firm* — Wayne F. Reinke, Esq.; Heslin Rothenberg Farley & Mesiti P.C.

(57) ABSTRACT

A system for separately handling different size FOUPs includes an end effector having a surface thereon for supporting a FOUP. The end effector and surface is configured to support different size FOUPs. A fixture or means for engaging and maintaining a FOUP, of different size FOUPs, included to position and maintain each of a different size FOUP on the end effector during transport thereof. A shelf is configured to receive each of said different size FOUPs. The end effector is thus capable of transporting either a first size FOUP or a second, smaller size FOUP.

16 Claims, 7 Drawing Sheets

SYSTEM FOR SEPARATELY HANDLING DIFFERENT SIZE FOUPS

FIELD OF THE INVENTION

The present invention relates to semiconductor wafer handling systems, and particularly, systems for handling different size FOUPs.

BACKGROUND OF THE INVENTION

Front opening unified pod or front opening universal pod systems used in handling semiconductor wafers are commonly referred to as FOUPs. A FOUP is typically formed of a specialized plastic enclosure which is designed to hold semiconductor wafers securely and safely in a protective environment. A FOUP includes a front opening section which allows the wafers to be inserted therein and removed therefrom for processing. The semiconductor wafers are typically stored and transported within a FOUP by robotic handling systems. Each FOUP is designed to hold a particular sized wafer. For example, 300 millimeter semiconductor wafers are transported and stored in 300 millimeter sized FOUPs. And, 450 millimeter semiconductor wafers are stored and handled in 450 millimeter FOUPs. Robotic handling systems are used to handle FOUPs. A robotic tool typically secures an end effector which transports a particular sized FOUP. The FOUP is then placed onto a shelf which receives that particular sized FOUP. Shelves and end effectors used to handle a 300 millimeter FOUP are neither configured or capable of handling a 450 millimeter FOUP. Conversely, an end effector and shelf which handles a 450 millimeter size FOUP is not useable to handle a 350 millimeter FOUP. Accordingly, different size shelves and end effectors have been used to handle (including receiving and storing) different size FOUPs.

Accordingly, a need exists for a system for separately handling different size FOUPs so that the same end effector and shelf can be used to separately handle each of different size FOUPS. For example, the system should be able to separately handle a 300 millimeter FOUP and a 450 millimeter FOUP.

BRIEF SUMMARY OF THE INVENTION

The shortcomings of the prior art are overcome and advantages are provided through the provision, in one aspect, of an apparatus for separately handling different size FOUPs. The apparatus includes an end effector having a surface thereon for supporting a FOUP, a fixture coupled to the surface of the end effector, and a shelf. The end effector and its surface are configured to separately support different size FOUPs, each FOUP sized to accommodate a different size substrate. The fixture is configured to engage each of said different size FOUPs and maintain each of the different size FOUPs in position on the end effector during transport thereof. The shelf is configured to receive the different size FOUPs, the shelf including a receiving area configured to receive the end effector therein such that each of the different size FOUPs is properly positioned on the shelf.

In one aspect, the apparatus includes an end effector having a surface thereon for supporting a FOUP, the end effector and surface being configured to separately support different size FOUPs, each FOUP sized to accommodate a different size substrate, means for engaging and maintaining each of said different size FOUPs in position on the end effector during transport thereof, and a shelf configured to receive each of said different size FOUPs, the shelf including a receiving area configured to receive the end effector therein such that each of the different size FOUPs is properly positioned on the shelf.

In yet another aspect, the invention includes a method of separately handling different size FOUPs. The method includes supporting a FOUP on a surface of an end effector, engaging each of different size FOUPs using a fixture coupled to the surface of the end effector, maintaining each of the different size in position on the end effector during transport thereof, and using a shelf configured to receive each of the different size FOUPs. The end effector and surface are configured to separately support the different size FOUPs, each FOUP sized to accommodate a different size substrate. In accordance with all aspects of the present invention, different size FOUPs may be separately handled using the same end effector and shelf, the shelf including a receiving area configured to receive the end effector therein such that each of the different size FOUPs is properly positioned on the shelf.

Additional features and advantages are realized through the principles of the present invention. Other embodiments and aspects of the invention are described in detail herein and are considered to be part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

The system, including method and apparatus, of the present invention is useable to separately handle different size FOUPs. Specifically, the method and apparatus is able to handle (e.g., for purposes of transport and/or storage) a first size FOUP at a particular handling process or time, and then handle a different size FOUP at a different handling process or time. The method and apparatus is capable of handling different size FOUPS at different times, for example, without modification to its structure.

Figure 1:
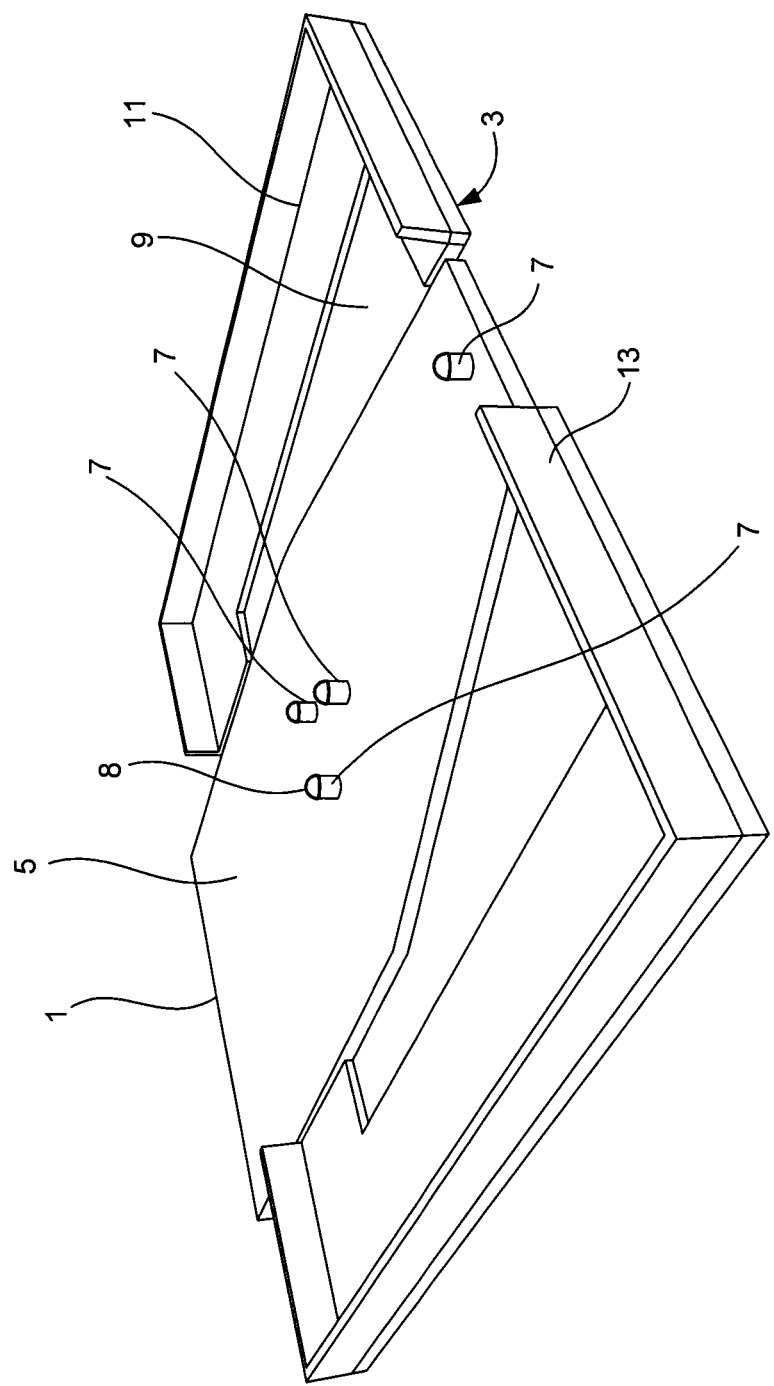
FIG. 1 depicts an perspective view of an end effector and shelf in accordance with the principles of the present invention.
Figure 2:
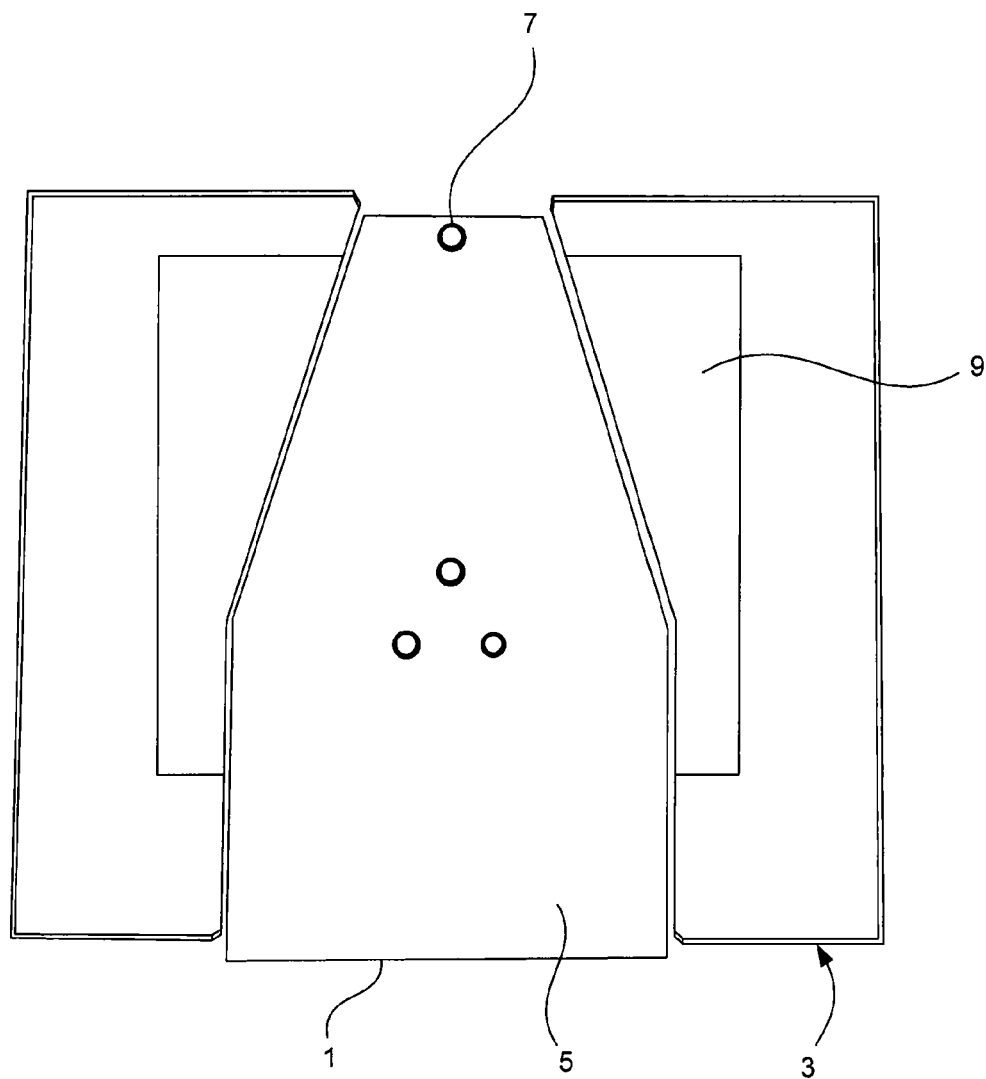
FIG. 2 depicts a top perspective view of the end effector and shelf of FIG. 1.

Referring to FIGS. 1 and 2, an apparatus for separately handling different size FOUPs in accordance with the principles of the present invention is shown. The apparatus includes an end effector 1 and a shelf 3. The end effector is preferably formed as a platform with a flat surface and includes a tapered end and an opposite non-tapered end. The non-tapered end is adapted and configured to be coupled to a robot tool end for handling by a robotic handling system. The surface 5 of the end effector 1 is configured to support each of different size FOUPs, for example, a 300 millimeter FOUP and, separately, a 450 millimeter FOUP. The end effector includes means for engaging and maintaining each of the different size FOUPs in position on the end effector during transport of the FOUPs.

As shown in FIGS. 1 and 2, a plurality of fixtures 7 are located on the surface 5 of the end effector 1. In one embodiment, the fixtures 7 are formed as pins. The fixtures, including pins, are configured to engage each of the different size FOUPs when the FOUPs are located on surface 5 of the end effector. The pins, for example, may be received within recesses within the bottom surface of a FOUP so as to mesh therewith. The pins 7 are preferably spring-loaded sensing pins, which are capable of retracting towards the surface of the end effector. In one aspect, the pins may be fully retractable. In another aspect, the pins may retract at the junction between the surface of the end effector and the stem of the pins. In yet another aspect, the tip of the pins may retract into the stems of the pins. For example, each pin may have a spherically shaped tip 8, which may be spring loaded and retracts into the stem of the pin 7. The interaction between the pins and FOUPs is designed and configured to prevent the FOUP from moving relative to the surface of the end effector during transport of the FOUP on the end effector by a robotic handling system. In other words, the pins, or other fixtures 7, engaged the FOUP so as to maintain the FOUP in position on said end effector during transport of the FOUP including by a robotic handling system.

The end effector 1 is configured and shaped to fit within shelf 3. Shelf 3 is sized and configured to receive different size FOUPs thereon. For example, shelf 3 is sized to receive a 450 millimeter FOUP, or separately, a 300 millimeter FOUP. Shelf 3, as shown in FIGS. 1 and 2, may be rectangularly shaped and includes an inner recessed portion 9 and an outer non-recessed portion 11. The non-recessed portion 11 is located overlying recessed portion 9 so that a step or lip exists in the transition area therebetween. Non-recessed portion of the shelf 11 bounds recessed portions 9 along the outer edges of the shelf 3. An outer wall 13 may be located at the edge of the shelf to create a border thereon within which each of the different size FOUPs will be located. End effector 1 fits within a receiving area of the shelf 3 which is preferably shaped in a tapered fashion to compliment the shape of end effector 1. In this manner, the end effector when moved by the robotic handling system and when containing a FOUP thereon may be lowered into the receiving area of the shelf to place the FOUP in proper position thereon.

Figure 3:
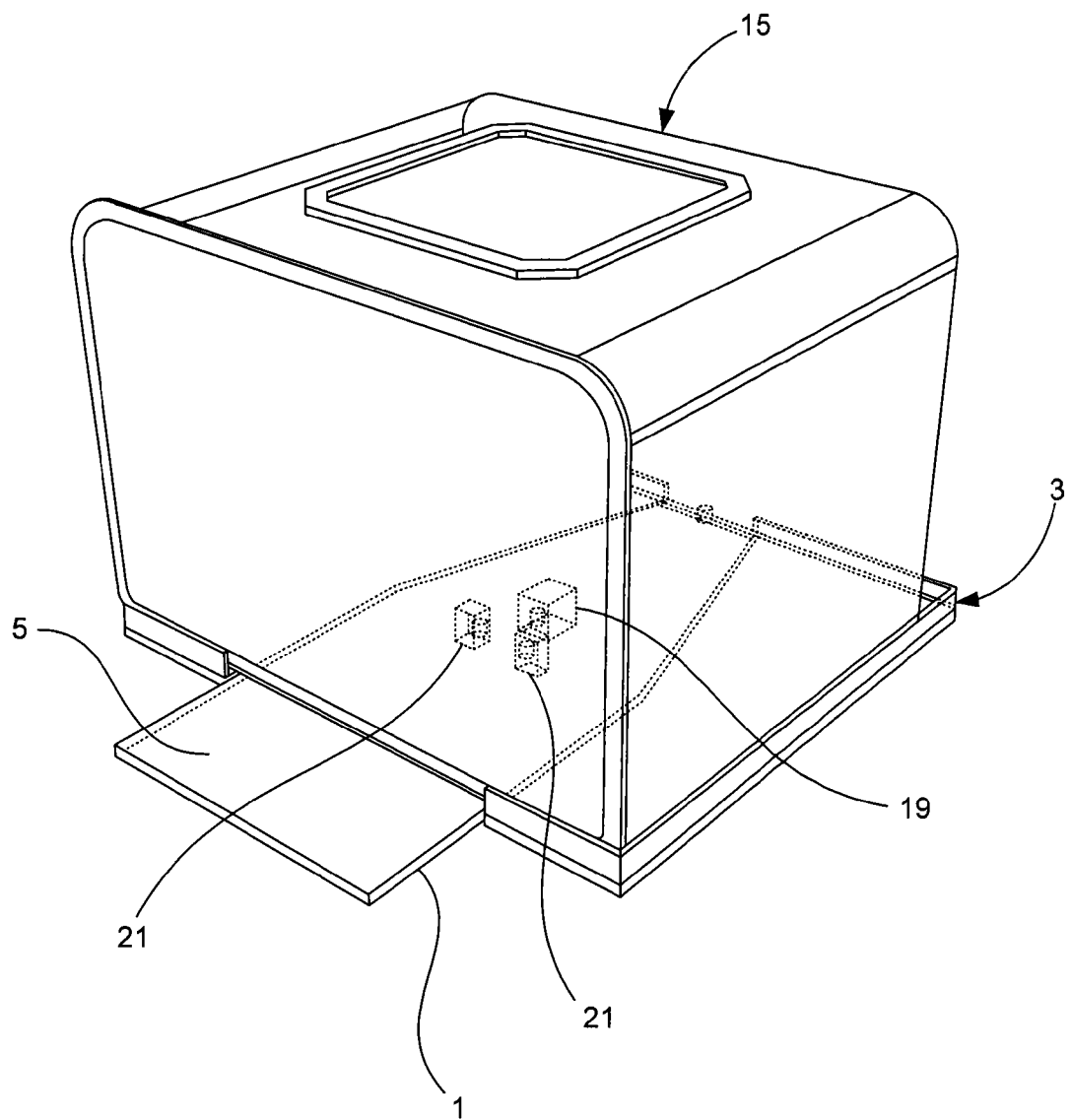
FIG. 3 depicts a perspective view of a 450 millimeter FOUP supported engaged on the surface of the end effector shown in FIGS. 1 and 2.

Referring now FIG. 3, a 450 millimeter FOUP 15 is shown on the shelf 3. As depicted in FIG. 3, the 450 millimeter FOUP 15 rests on the non-recessed portion 11 of the shelf 3 within walls 13 of the shelf 3. The depth of the recessed area of the shelf 3 wherein the end effector fits, may be sized to allow the end effector to be lowered and disengaged from the FOUP 15 transported thereon. In this manner, upon disengagement of the FOUP 15 when placed on the shelf 3 the end effector can be further lowered and removed from the shelf by withdrawal thereof via the robotic handling system. In this manner, the FOUP 15 can be retained on the shelf 3 and the end effector 1 removed therefrom and used to obtain a new FOUP for placement on a different but similarly sized and configured shelf 3. Accordingly, the end effector 1 can be used to transport one of a first size FOUP to a particular shelf 3, place the FOUP on the particular shelf, at a later time. The end effector can receive a second different size FOUP and transport the same to a second shelf, which is identical in configuration to the first shelf 3. Accordingly, a single size end effector and single size shelf can be used in sets to separately handle different size FOUPs.

Figure 4:
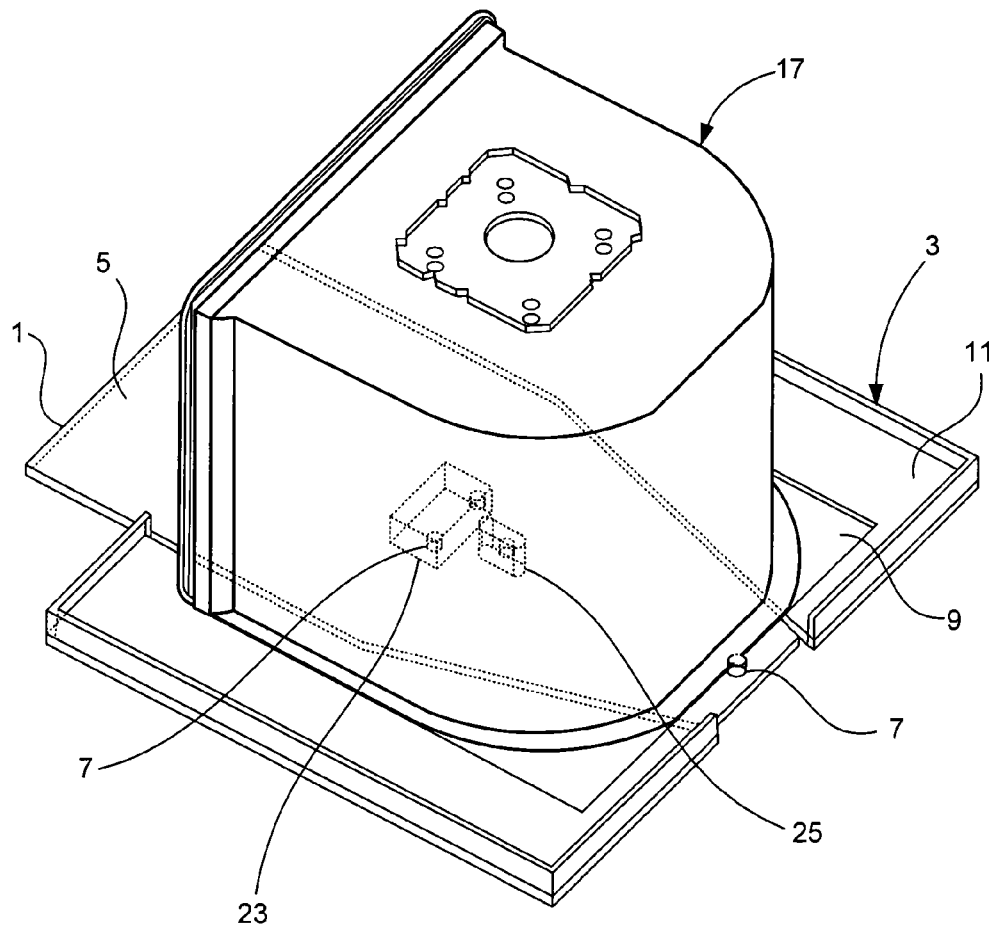
FIG. 4 depicts a perspective view of a 300 millimeter FOUP on the shelf and end effector of FIGS. 1 and 2.

FIG. 4 depicts a view of a second size 300 millimeter FOUP 17 on the shelf 3. The FOUP is received onto the recessed portion 9 of the shelf 3. As previously described, once the FOUP 17 is rested on the shelf 3, including the recessed portion 9 supporting the 300 millimeter FOUP, the end effector 1 may be lowered from the FOUP 17 while located in the receiving area of the shelf 3 to disengage the FOUP 17. Then the FOUP 17 withdrawn from the receiving area to allow the FOUP 17 to rest on the shelf 3 so that the end effector 1 may be used to transport additional FOUPs to other similarly configured shelves.

Figure 5:
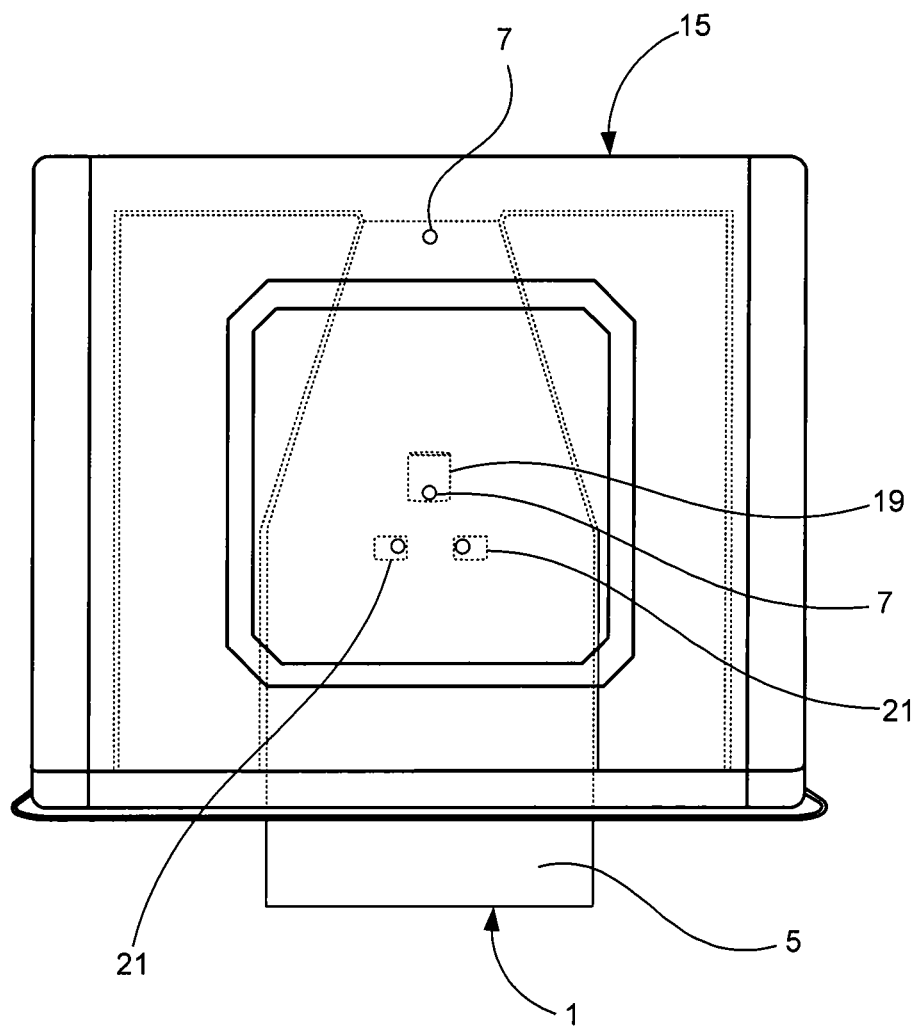
FIG. 5 depicts a schematic perspective view of one technique for engaging a 450 millimeter FOUP onto the end effector of FIGS. 1 and 2.

Referring now to FIG. 5, a schematic representation of the method of engagement of the 450 millimeter FOUP 15 depicted in FIG. 3 on the end effector 1 is shown. In such embodiment, the means for engaging and maintaining each of the different size FOUPs in position on the end effector during transport, for example, fixtures, includes pins 7. The pins 7 fit into recesses 19, 21 located on the bottom of the FOUP 15. Preferably, each pin is received within a recess 19, 21 on the bottom surface of the FOUP 15. When the pins are received in such recesses, the pins maintain the FOUP on the surface of the FOUP 15 to prevent movement thereon during transport or other handling. The meshing of the pins 7 within the recesses 19, 21 prevents the FOUP 15 from shifting laterally on the surface both forwards and sideways. Attempts to shift the FOUP 15 on the surface of the end effector either forwards or sideways will result in the pins 7 contacting edges of the recesses 19, 21 and thus preventing further movement thereof. In this embodiment, the weight of the FOUP 15 may be sufficient to prevent the FOUP 15 being lifted on the surface of the end effector during normal handling including normal transport by a robotic handling system.

Figure 6:
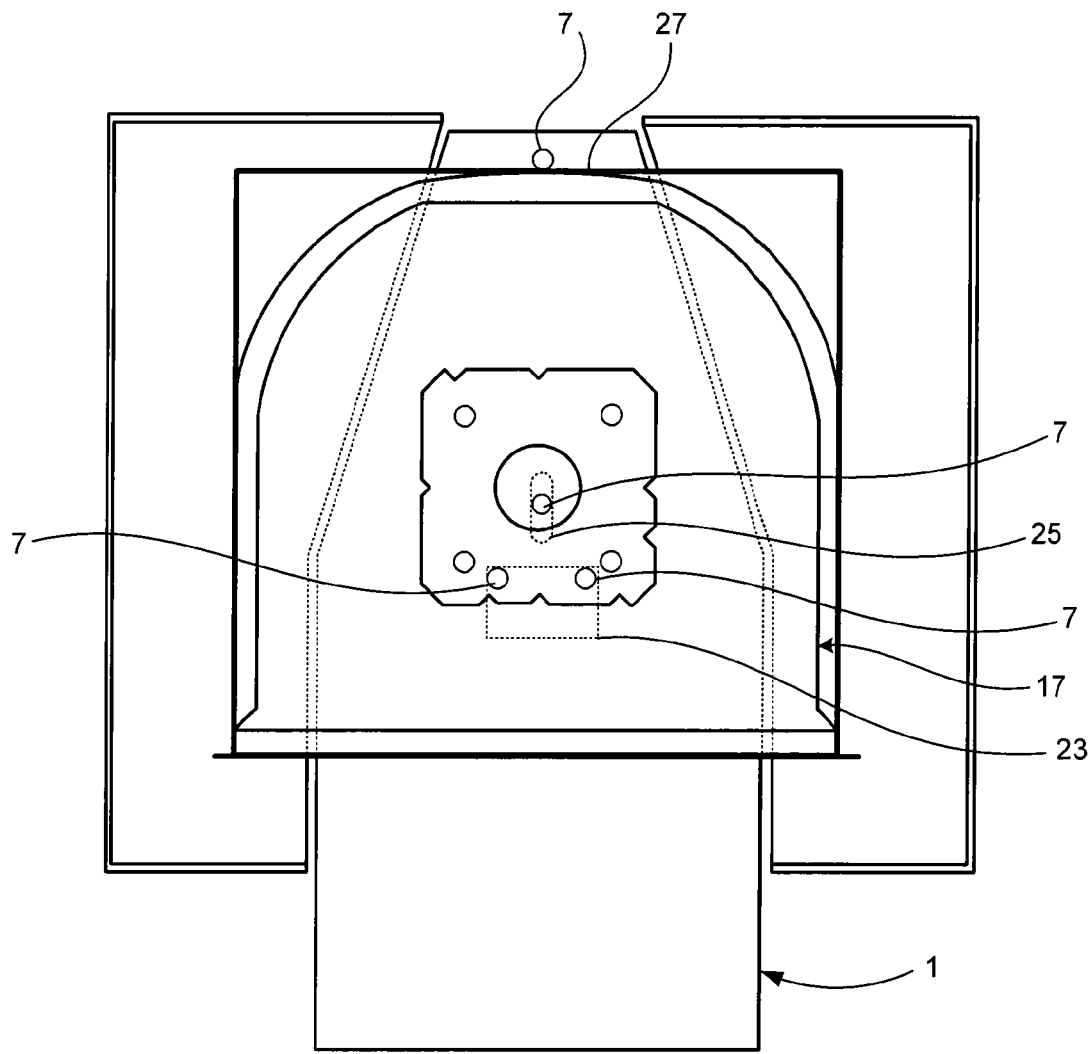
FIG. 6 depicts a schematic perspective view of one technique of engaging a 300 millimeter FOUP on the shelf of FIGS. 1 and 2.

Referring now to FIG. 6, one technique for engagement of a 300 millimeter FOUP 17 on the same end effector 1 shown in FIGS. 1-5, is shown. The spring-loaded pins 7, using this technique, protrude into recesses within the bottom of the FOUP and/or align adjacent an outer edge of the FOUP. For example, the three pins located towards the center of the end effector fit within recesses 23, 25 of the FOUP 17. Specifically, one pin 7 fits into a single recess 25 formed in the bottom of the FOUP 17 and two pins fit into another larger recess 23 located and also formed in the bottom of the FOUP 17. However, a single pin 7 located towards the tapered edge of the end effector will be positioned adjacent an edge 27 of the FOUP but not necessarily within any recess thereof. In this manner, each of the pins 7 will prevent the lateral shifting of the 300 millimeter FOUP 17 on the surface of the end effector during normal transport thereof. Forces which will tend to move the FOUP 17 laterally on the end effector will cause the pins 7 to contact the edges of the recesses 23, 25 within which the pins 7 are located, and/or the edge 27 of the bottom surface of the FOUP 17. As similarly discussed with reference to FIG. 5, the FOUP 17 depicted in FIG. 6, will have such a weight so as to prevent lifting off of the surface of the end effector 1 during normal transport of the FOUP thereon.

Figure 7:
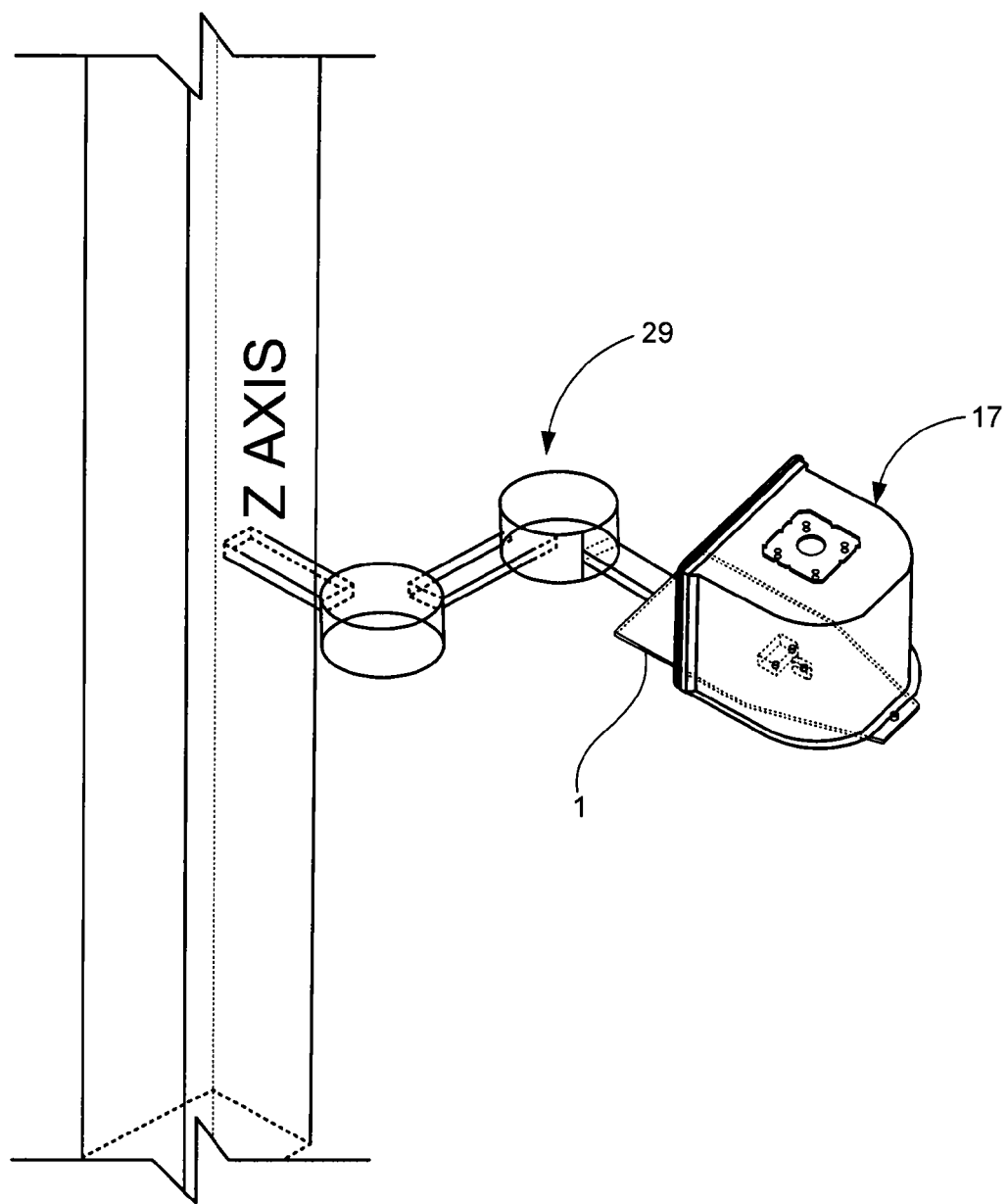
FIG. 7 depicts a perspective view of a robot coupled to the end effector of FIGS. 1 and 2 supporting a FOUP thereon during handling.

Referring now to FIG. 7, a robotic handling system 29 useable with the end effector 1 and shelf in accordance with the principles of the present invention as shown. The robot is affixed or coupled to the effector 1 at its end opposite the tapered end so that the end effector may be used to transport the FOUPs 15, 17. The fixtures 7 located on the end effector, and/or means for maintaining and engaging the FOUP 17 on the end effector, will maintain the FOUP in position on the end effector 1 during transport thereof. Although not shown, various sensors may be used to control the movement of the robotic handling system. For example, sensors located proximate to the shelf may be used to sense the movement of the FOUP including the placement of the FOUP onto the shelf in proper position. Once such proper position is sensed, the sensor may send a signal to the robotic handling system to lower, for example, the end effector and withdraw the same from the shelf. Similarly, sensors may be used to sense the location of the FOUP prior to placement onto the shelf to control the movement of the end effector by the robotic handling system.

Other means for engaging and maintaining each of the different size FOUPs in position on the end effector during transport thereof may be incorporated into the principles of the present invention. That is, particular type fixtures may be used to achieve the desired result of maintaining the different size FOUPs on position on the end effector during normal transport. Such fixtures and/or means may include suction devices including vacuum suction devices, friction devices including surfaces on the top of the end effector and/or the bottom of the FOUP which include enhanced friction capabilities to prevent lateral movement between the FOUP and end effector, as well as clamping devices. Such clamping devices may include spring loaded clips or clamps which engage the FOUPs including specific structures or areas of the FOUPs.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus for separately handling different size FOUPs comprising:
    an end effector having a surface thereon for supporting a FOUP, said end effector and surface being configured to separately support different size FOUPs, each FOUP sized to accommodate a different size substrate;
    a fixture coupled to the surface of said end effector, said fixture configured to engage each of said different size FOUPs and maintain each of said different size FOUPs in position on said end effector during transport thereof; and
    a shelf configured to receive each of said different size FOUPs, wherein said shelf comprises a receiving area configured to receive said end effector therein such that each of said different size FOUPs is properly positioned on said shelf.

2. The apparatus of claim 1 wherein said shelf comprises a recessed portion for receiving a first size FOUP.

3. The apparatus of claim 1 wherein said shelf comprises a non-recessed portion for supporting a second size FOUP.

4. The apparatus of claim 3 wherein said non-recessed portion of said shelf bounds said recessed portion of said shelf.

5. The apparatus of claim 3 wherein said first size FOUP is smaller than said second size FOUP.

6. The apparatus of claim 1 wherein said fixture comprises an at least one protrusion, said protrusion being receivable within a recess formed within the bottom of said multiple size FOUPs.

7. The apparatus of claim 6 wherein said fixture comprises at least one structure which engages a bottom edge of said different size FOUP.

8. A method of separately handling different size FOUPs comprising:
    supporting a FOUP on a surface of an end effector, said end effector and surface being configured to separately support different size FOUPs, each FOUP sized to accommodate a different size substrate;
    engaging each of said different size FOUPs using a fixture coupled to the surface of said end effector;
    maintaining each of said different size FOUPs in position on said end effector during transport thereof; and
    using a shelf configured to receive each of said different size FOUPs, wherein said shelf comprises a receiving area configured to receive said end effector therein such that each of said different size FOUPs is properly positioned on said shelf.

9. The method of claim 8 wherein said shelf comprises a recessed portion for receiving a first size FOUP.

10. The method of claim 9 wherein said first size FOUP is smaller than said second size FOUP.

11. The method of claim 8 wherein said shelf comprises a non-recessed portion for supporting a second size FOUP.

12. The method of claim 11 wherein said non-recessed portion of said shelf bounds said non-recessed portion of said shelf.

13. The method of claim 8 wherein said fixture comprises an at least one protrusion, said protrusion being receivable within a recess formed within the bottom of said multiple size FOUPs.

14. The method of claim 13 wherein said fixture comprises at least one structure which engages a bottom edge of said different size FOUP.

15. An apparatus for separately handling different size FOUPs comprising:
    an end effector having a surface thereon for supporting a FOUP, said end effector and surface being configured to separately support different size FOUPs, each FOUP sized to accommodate a different size substrate;
    means for engaging and maintaining each of said different size FOUPs in position on said end effector during transport thereof; and
    a shelf configured to receive each of said different size FOUPs, wherein said shelf comprises a receiving area configured to receive said end effector therein such that each of said different size FOUPs is properly positioned on said shelf.

16. The apparatus of claim 15 wherein said means for engaging and maintaining comprises at least one of pins, a suction device, a friction device, or a clamping device.

* * * * *